(12) United States Patent
Meyer (10) Patent No.: US 12,538,609 B2
(45) Date of Patent: Jan. 27, 2026

(54) DEVICE AND METHOD FOR REPLACING AT LEAST ONE CHIP

(71) Applicant: OSRAM Opto Semiconductors GmbH, Regensburg (DE)

(72) Inventor: Tobias Meyer, Kelheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 898 days.

(21) Appl. No.: 17/434,495

(22) PCT Filed: Feb. 13, 2020

(86) PCT No.: PCT/EP2020/053700
§ 371 (c)(1),
(2) Date: Aug. 27, 2021

(87) PCT Pub. No.: WO2020/173712
PCT Pub. Date: Sep. 3, 2020

(65) Prior Publication Data
US 2022/0140180 A1    May 5, 2022

(30) Foreign Application Priority Data
Feb. 27, 2019    (DE) .................... 10 2019 105 031.6

(51) Int. Cl.
*H10H 20/01*    (2025.01)
*H01L 25/075*    (2006.01)

(52) U.S. Cl.
CPC ......... *H10H 20/01* (2025.01); *H01L 25/0753* (2013.01)

(58) Field of Classification Search
CPC ....... H05K 1/0295; H05K 2201/10053; H05K 2201/10106; H05K 2203/173;
(Continued)

(56) References Cited

U.S. PATENT DOCUMENTS 5,953,216 A    9/1999  Farnworth et al.
10,312,165 B1 *  6/2019  Hsiang ................ H01L 25/0753
(Continued)

FOREIGN PATENT DOCUMENTS

CN    101681908 A    3/2010
CN    102426948 A    4/2012
(Continued)

OTHER PUBLICATIONS

International Search Report issued for corresponding International Patent Application No. PCT/EP2020/053700 on May 28, 2020, along with an English translation.
(Continued)

*Primary Examiner* — Latanya N Crawford Eason
(74) *Attorney, Agent, or Firm* — Hauptman Ham, LLP (57) ABSTRACT

A device for replacing at least one chip or electronic element of an electronic component, in particular an LED package or an LED display, includes at least two standard electrical contacts to which a chip comprising at least two electrical contacts is electrically connectable. The device also includes an electronic switch electrically connecting the first standard electrical contact to an electrical power supply source, and least three electrical repair contacts to which a repair chip identical in construction to the chip is electrically connectable. The first electrical repair contact is electrically connected to the electrical power supply source. The second electrical repair contact is electrically connected to the electronic switch. The third electrical repair contact is electrically connected to the second electrical standard contact.

22 Claims, 6 Drawing Sheets

(58) Field of Classification Search
CPC .... H05K 2203/176; H05K 2201/10166; H01L 33/0095; H01L 25/0753; H01L 25/0756; G02F 1/136259; H10H 20/01; H10H 29/011; H10H 29/03; H10H 29/032; H10H 29/02

See application file for complete search history.

(56) References Cited

U.S. PATENT DOCUMENTS

| | | | |
|---|---|---|---|
| 2006/0240578 A1* | 10/2006 | Oohata | H01L 24/82 438/26 |
| 2011/0180817 A1 | 7/2011 | Ishizaki et al. | |
| 2015/0187839 A1 | 7/2015 | Ishiguro et al. | |
| 2016/0351457 A1 | 12/2016 | Chen et al. | |
| 2016/0351548 A1 | 12/2016 | Chen et al. | |
| 2018/0292073 A1 | 10/2018 | Mattila | |
| 2018/0358339 A1 | 12/2018 | Iguchi | |

FOREIGN PATENT DOCUMENTS

| | | |
|---|---|---|
| CN | 103140031 A | 6/2013 |
| CN | 208170084 U | 11/2018 |
| EP | 2 204 856 A1 | 7/2010 |
| JP | 2010-161123 A | 7/2010 |
| JP | 2011-151268 A | 8/2011 |
| JP | 2015-126077 A | 7/2015 |
| KR | 10-2017-0049117 A | 5/2017 |
| TW | M453795 U1 | 5/2013 |

OTHER PUBLICATIONS

Written Opinion issued for corresponding International Patent Application No. PCT/EP2020/053700 on May 28, 2020.

* cited by examiner

DEVICE AND METHOD FOR REPLACING AT LEAST ONE CHIP

CROSS REFERENCE TO RELATED APPLICATIONS

This application is a National Stage of International Application No. PCT/EP2020/053700, filed on Feb. 13, 2020, which designates the United States and was published in Europe, and which claims priority to German Patent Application No. 10 2019 105 031.6, filed on Feb. 27, 2019, in the German Patent Office. Both of the aforementioned applications are hereby incorporated by reference in their entireties.

This patent application claims priority to German application DE 10 2019 105 031.6, the disclosure content of which is hereby incorporated by reference.

FIELD

The invention relates to a device and method for replacing chips, which may equally be referred to as electronic element. Examples of chips may include chips of light emitting diodes (LEDs). Chips may be placed in an electronic components. Such components may be an LED package, an LED package with multiple LEDs, or a display or display with LEDs.

BACKGROUND

Defective light-emitting diodes are undesirable. If a component comprises a large number of chips, the probability that a defective chip will be installed in the component increases.

Conventionally, for example, packages are tested with at least one LED. If this is defective, it is discarded. The defective chip is removed and replaced by a functioning chip. A repair chip is placed in the component in addition to the defective chip. However, the defective chip must be deactivated. Conventionally, an electronic circuit is used that specifies from outside the component that the defective chip should no longer be energized. A further deactivation is carried out, for example, by cutting the current feedthrough to the defective chip using a laser that cuts through conductor tracks.

SUMMARY

Nevertheless, there is still a need for electronic components that comprise chips or electronic elements to replace defective chips or electronic elements in an improved manner and to switch them powerless.

This need is met by a device according to the main claim and a method according to the subsidiary claim.

According to a first aspect, a device for replacing at least one chip or electronic element of an electronic component, such as an LED package or display, is proposed, comprising
  at least two standard electrical contacts to which a chip comprising at least two electrical contacts is electrically connectable;
  an electronic switch that electrically connects the first standard electrical contact to a power supply source;
  at least three electrical repair contacts to which a repair chip identical in construction to the chip is electrically connectable, the first electrical repair contact being electrically connected to the power supply source, the second electrical repair contact being electrically connected to the electronic switch, and the third electrical repair contact being electrically connected to the second standard electrical contact.

According to a second aspect, a method for replacing at least one chip or electronic element of an electronic component, for example an LED package or a LED display, by means of a device according to the invention is proposed, comprising the following steps
  electrically connecting a chip comprising at least two electrical contacts to at least two standard electrical contacts;
  checking the quality of the chip and identify it as a defective chip;
  electrically connecting a repair chip identical in construction to the chip to at least three electrical repair contacts, wherein the repair chip is power supplied by means of the first and third repair contacts and electrically connects the first and second repair contacts to one another in such a way that an electronic switch disconnects the defective chip from a power supply source.

The functionality of a defective chip can be replaced by a repair chip. The repair chip can be placed in a component, which can be a display, for example. In the process, the repair chip is placed on two contacts that are not initially electrically connected. The repair chip electrically connects these contacts. As a result, a current can now flow between the contacts. This current flow can be used, for example, to interrupt the current flow to the defective chip with the aid of an electrical circuit.

Repair contacts are in particular contacts to which an electrical repair chip can be connected.

A power supply source may be an electrical current source and/or an electrical voltage source.

Compared to a complicated conventional electrical circuit, which may switch between the defective chip and the repair chip by means of an external connection, the device proposed according to the invention or the corresponding method is simpler and less expensive to execute. Accordingly, a device according to the invention is simpler and less expensive to manufacture. The electronic switch can be formed on a planar carrier or substrate which also carries, in particular in a common plane, the electrical repair contacts, in particular the first and second electrical repair contacts, and the standard electrical contacts, in particular the first standard electrical contact. The first standard electrical contact is electrically connected to a power supply source, wherein the second standard electrical contact is grounded or electrically connected to a counterpole, negative or positive pole, to the power supply source. A device according to the invention may, for example, be formed as an integrated circuit on a planar substrate or carrier.

A repair chip can be identical in construction to the chip. Accordingly, the repair chip is spatially identical to the chip. The repair chip has the same function as the chip. The repair chip comprises the same electrical contacts as the chip in terms of position and size. The chip and the repair chip comprise an electrically conductive material that can also electrically connect two electrical contacts that are not electrically connected to each other during electrical contacting.

Further advantageous examples are suggested in connection with the subclaims.

According to a further embodiment, the electronic switch may be a transistor, in particular a field-effect transistor, to the base or respectively gate of which the second electrical repair contact is electrically connected. Transistors are easy to integrate into the device and easy to use.

According to a further embodiment, the first electrical contact of the electrically connected repair chip may electrically connect the first electrical repair contact to the second electrical repair contact. By means of this electrical connection, a defective chip can be switched off from or electrically disconnected from a current and/or voltage source.

According to another aspect, the second electrical contact of the electrically connected repair chip may be electrically connected to the third electrical repair contact. Together with the first electrical repair contact, the repair chip can be power supplied in this way, in particular electrically connected to an electrical voltage and/or current source.

According to a further embodiment, the second standard electrical contact and the third electrical repair contact may be electrically grounded.

According to a further embodiment, the first electrical contact of the repair chip may comprise an electrically conductive material forming a surface having a first thickness.

According to a further embodiment, the standard electrical contacts and the electrical repair contacts may each comprise an electrically conductive material forming a surface, in particular an identical surface, with a second thickness.

According to a further embodiment, the first thickness may be equal to the second thickness.

According to a further embodiment, the surfaces of the first and second standard electrical contacts may each be rectangular, square, or circular.

According to a further embodiment, the surfaces of the first and second electrical repair contacts may be arranged in one plane and together may be rectangular, square, or circular in shape as a total surface area.

According to a further embodiment, at least one additional contact surface may be added to the surfaces of the first and second electrical repair contacts arranged in one plane, wherein the overall surface may be rectangular, square, or circular in shape.

According to a further embodiment, the surface of the first standard electrical contact may be divided into at least two surfaces being arranged in one plane separated from each other.

According to a further embodiment, the surfaces of the first standard contact may together form a rectangle, a square, or a circle.

According to a further embodiment, the surfaces of the first standard contact may resemble the surfaces of the first and second electrical repair contacts.

According to a further embodiment, the first and second electrical repair contacts may be arranged in a plane with the first standard electrical contact, and the third electrical repair contact may be arranged in a plane with the second standard electrical contact.

According to a further embodiment, the first, second, and third electrical repair contacts may be arranged in a plane, and the second electrical contact of the electrically connected repair chip may comprise a electrically conductive material forming surface and having a third thickness.

According to a further embodiment, the surface of the third electrical repair contact may be divided into two surfaces being arranged in a plane and being separated from each other.

According to a further embodiment, the surface(s) of the third electrical repair contact may be rectangular, square, or circular.

According to a further embodiment, the first and second electrical repair contacts may be arranged in the plane, in particular X-Y plane, with a first spacing adjacent to the first standard electrical contact, and the first and second electrical repair contacts may form a module together with the first standard electrical contact, wherein a plurality of modules may be arranged with a second spacing adjacent to each other along an X axis and with a third spacing adjacent to each other along a Y axis.

According to a further embodiment, the chip comprising at least two electrical contacts may be electrically connected to the at least two standard electrical contacts.

According to a further embodiment, a plurality of chips, in particular 100 to 10000000, can be simultaneously electrically connected, checked and, if necessary, replaced by a repair chip.

According to a further embodiment, checking the quality of a chip may be performed by means of electrical operation, optical inspection, or drawing on data from previous process steps.

BRIEF DESCRIPTION OF THE DRAWINGS

The invention is described in more detail by means of examples in connection with the figures. Showing.

DETAILED DESCRIPTION

Figure 1:
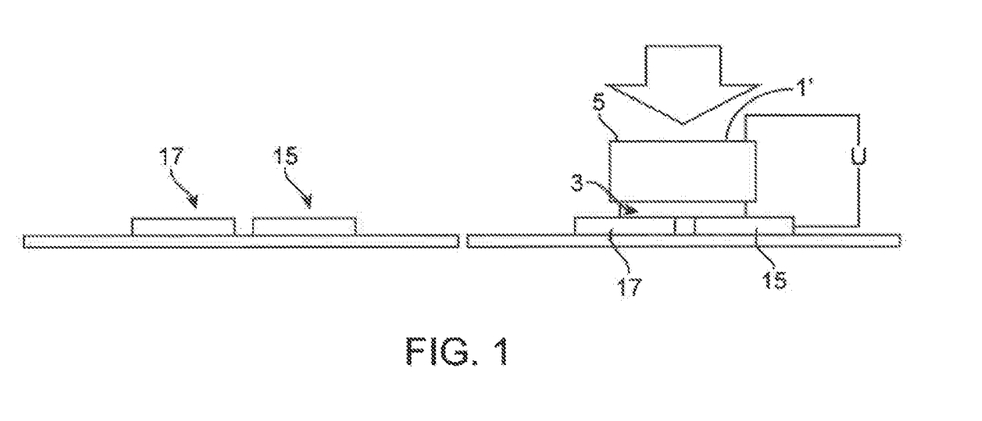
FIG. 1 a first example of repair contacts according to the invention and their use.

FIG. 1 shows an example of repair contacts according to the invention. On the left side of FIG. 1, a first repair contact 15 and a second repair contact 17 are shown in cross-section. On the right side of FIG. 1 the operating principle of the first repair contact 15, the second repair contact 17 together with the surface of the first electrical contact 3 of a repair chip 1' is shown.

The repair chip 1' is placed on two contacts, these being provided by means of a first repair contact 15 and a second repair contact 17. A chip 1 or a repair chip 1' comprises an electrically conductive material that electrically connects the two repair contacts 15 and 17. The electrically conductive material is formed here as an electrical contact 3 of a chip 1 and in particular of a repair chip 1'.

The repair chip 1' electrically connects the two repair contacts 15 and 17 and comprises a further additional electrical contact 5. A voltage U can be applied between this further electrical contact 5 and the repair contacts 15 and 17 electrically connected by means of the repair chip 1', which enables current to flow through the repair chip 1' so that it can be operated.

The large arrow in FIG. 1 on the right-hand side illustrates that the repair chip 1' is applied to the two repair contacts 15 and 17. The conductive material of the first electrical contact 3 of a chip 1, respectively of the repair chip 1', which electrically connects the two repair contacts 15 and 17, may comprise metal, transparent electrically conductive oxide (TCO) and/or a semiconductor doped with a doping type.

Figure 2:
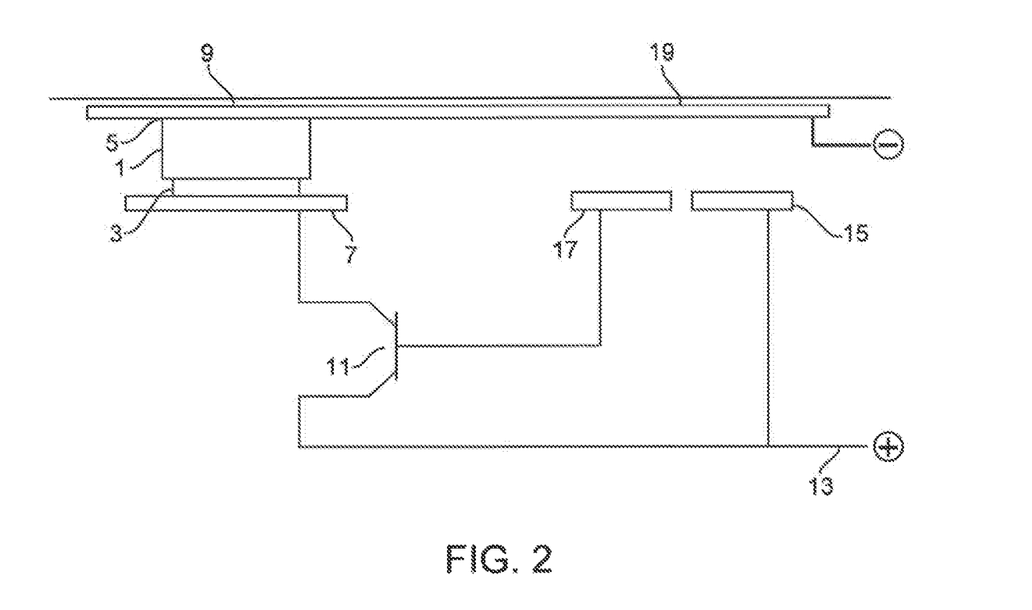
FIG. 2 an example of a device according to the invention with a chip and without a repair chip.

FIG. 2 shows an example of a device according to the present invention with a chip 1 and without a repair chip 1'. FIG. 2 shows a chip 1 that has been incorporated into a device according to the present invention. The chip 1 may be part of an electronic component, in particular an LED package or a light emitting diode (LED) display. Here, the device comprises two opposing standard electrical contacts 7 and 9 to which a chip 1 having two electrical contacts 3 and 5 is electrically connected. The device comprises an electronic switch 11 electrically connecting the first standard electrical contact 7 to a power supply source 13. That is, the electronic switch 11 is electrically closed in a basic state and thus electrically connects the power supply source 13 to the first standard electrical contact 7 so that, in addition, the first electrical contact 3 of the chip 1 is also power supplied. For example, the first standard electrical contact 7 and the first electrical contact 3 of the chip 1 may be electrically connected to a terminal or positive terminal of the power supply device. The second electrical contact 5 of the chip 1 may be electrically connected to ground or a negative terminal of the electrical power supply source 13 by means of the second standard electrical contact 9. Similarly, the first standard contact 7 may be connected to a negative terminal, and the second standard contact 9 may be connected to a positive terminal accordingly.

FIG. 2 shows a device according to the invention in a basic state in which chip 1 is functioning and thus intact. Accordingly, no repair chip 1' is required. The first and second repair contacts 15 and 17 are not electrically connected to each other. Accordingly, the electronic switch 11 is electrically closed. Chip 1 is electrically powered by means of power supply source 13 such that an electric current can flow through chip 1. However, FIG. 2 may further represent a state in which chip 1 is defective. A current can still flow through a defective chip 1". The defective chip 1" can then be, for example, a light-emitting diode LED that is too dark.

Figure 3:
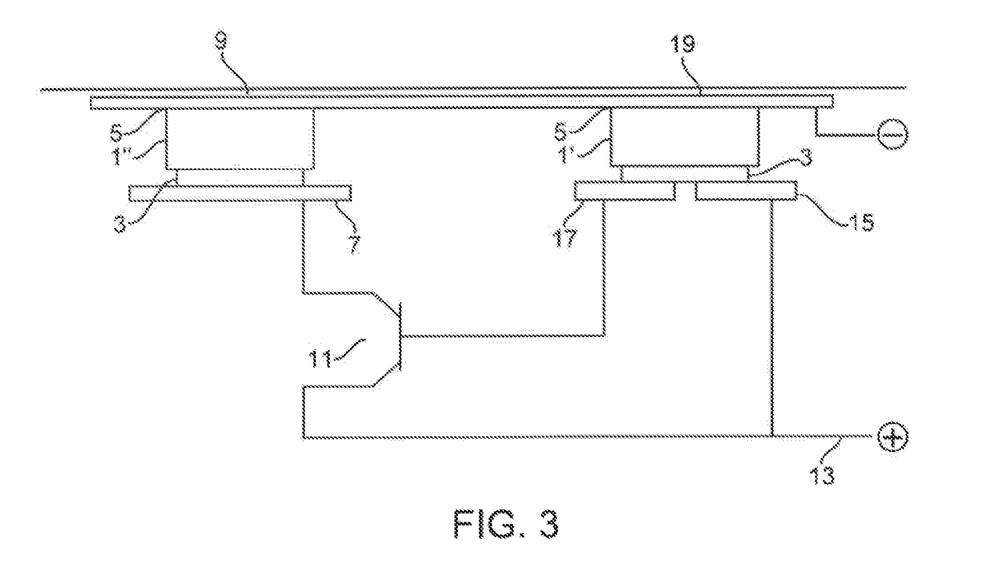
FIG. 3 a second example of a device according to the invention, namely with a defective chip and a repair chip.

FIG. 3 shows another example of a device according to the invention. FIG. 3 shows FIG. 2, but with the difference that the original intact chip 1 has been identified as a defective chip 1", and a repair chip 1' has been electrically connected to the device. On the right side of FIG. 3 the repair chip 1' is shown. This is electrically connected to and connected to a first repair contact 15 and a second repair contact 17, wherein a first electrical contact 3 of the repair chip 1' electrically connects the first repair contact 15 to the second repair contact 17. In addition, the device comprises a third repair contact 19 to which the second electrical contact 5 of the repair chip 1' is electrically connected and electrically contacted thereto. The third repair contact 19 may be electrically connected to a negative terminal of a power supply source 13 or electrically connected to ground. A power supply source 13 may be an electric current source and/or voltage source.

FIG. 3 shows how the repair chip 1' has been placed on the first repair contact 15 and on the second repair contact 17. FIG. 3 shows how a repair chip 1' identical in construction to chip 1 is electrically connectable to at least three electrical repair contacts 15, 17 and 19. The first electrical repair contact 15 is electrically connected to a power supply source 13, the second electrical repair contact 17 is electrically connected to the electronic switch 11, and the third electrical repair contact 19 is electrically connected to the second standard electrical contact 9, wherein the second standard electrical contact 9 together with the third electrical repair contact 19 may be connected to a negative source of a power supply source 13. Alternatively, the second standard electrical contact 9 and the third electrical repair contact 19 may be electrically connected to ground. FIG. 3 shows how the repair chip 1' is connected to the power supply source 13 by means of the first repair contact 15 in such a way that an electrical current can flow through the repair contact 1' via the first electrical contact 3 and the second electrical contact 5 of the repair chip 1' via the third electrical repair contact 19. In this way, the defective chip 1" has been functionally replaced. The repair chip 1' thus replaces the function of the defective chip 1". As a result of the first electrical contact 3 electrically connecting the first repair contact 15 to the second repair contact 17, the electronic switch 11 is electrically opened in such a way that no more current can flow through the defective chip 1" or that no more electrical power is supplied to the defective chip 1". For example, a transistor or a field-effect transistor can be used as the electronic switch 11. The second electrical repair contact 17 is then electrically connected either to the base of the transistor or to the gate of the field-effect transistor.

Figure 4:
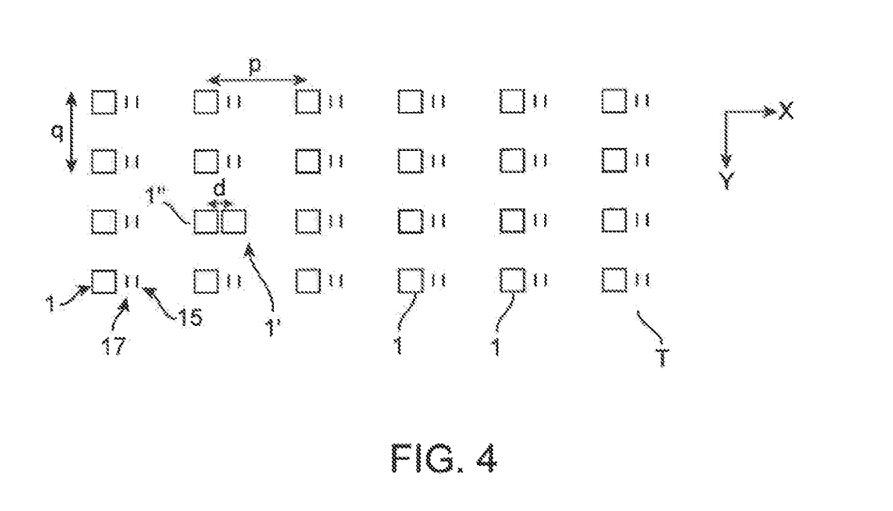
FIG. 4 another example of a device according to the invention, namely an array or field of chips together with repair contacts on a carrier.

FIG. 4 shows a further example of a device according to the invention, namely an array of chips 1 together with electrical repair contacts 15 and 17 on a common carrier T. According to this example, the chips 1 are arranged regularly, in this case in the form of a grid. By means of such an array of here, for example, light emitting diode (LED) chips 1, a display or a visual display can thus be realized. Within a component, several types of chips 1 can each be arranged to form a grid. Chips 1 here may be, for example, red, green and blue LEDs. In addition to the positions where chips 1 are located according to FIG. 4, electrical repair contacts 15 and 17 are provided on which a respective repair chip 1' can be placed. FIG. 4 shows that the first and second electrical repair contacts 15 and 17 can be arranged in an X-Y plane with a first distance d next to a respective chip 1 along an X-axis. A chip 1 together with the first and second repair contacts 15 and 17 forms a module. A plurality of such modules are arranged with a second spacing p adjacent to each other along an X-axis and with a third spacing q adjacent to each other along a Y-axis. FIG. 4 shows how in such an array a square chip 1' replaces a defective chip 1". The regularly arranged chips 1 have a mean distance p from each other. The average distance between the chips 1 and the first and second electrical repair contacts 15 and 17 or the repair chips 1' is d. For example, d≤0.5 p, in particular d≤0.1 p.

Figure 5:
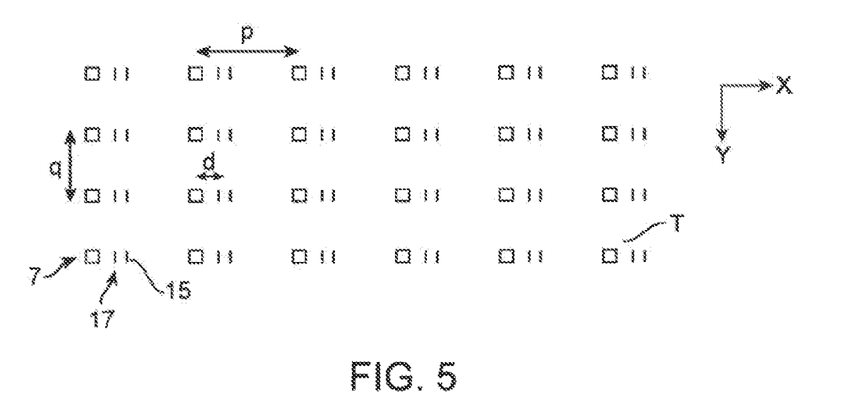
FIG. 5 shows another example of a device according to the invention as an array of electrical contacts on a carrier.

FIG. 5 shows a further example of a device according to the invention as an array of electrical contacts on a common carrier T. The respective electronic switches 11 are not shown, but can be formed on the carrier T, for example as an integrated circuit. In an X-Y plane, first standard electrical contacts 7 and first and second electrical repair contacts 15 and 17 are arranged to form a grid or field or array. These are required to produce an array as shown in FIG. 4. Here, first and second electrical repair contacts 15 and 17 are arranged in the X-Y plane with a first spacing d adjacent to a respective first standard electrical contact 7, and likewise here, first and second electrical repair contacts 15 and 17 together with an adjacent first standard electrical contact 7 form a module, a plurality of such modules being arranged with a second spacing p adjacent to each other along an X-axis and with a third spacing q adjacent to each other along a Y-axis. According to FIG. 5, instead of chips 1, respective first standard electrical contacts 7 integrated to a common carrier T are shown.

Figure 6:
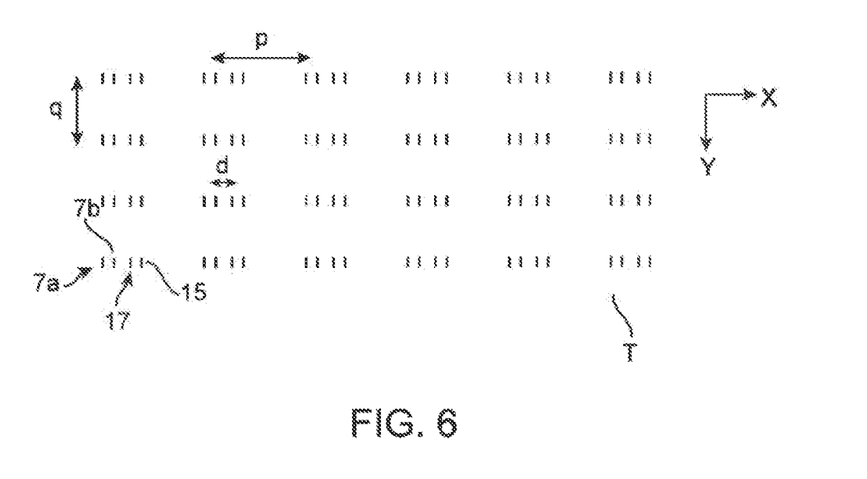
FIG. 6 shows another example of a device according to the invention as an array of electrical contacts on a carrier.

FIG. 6 shows another example of a device according to the invention as an array of electrical contacts on a common carrier T. In contrast to FIG. 5, first standard electrical contacts 7 are used here, the design of which corresponds to the design of the first and second electrical repair contacts 15 and 17. Accordingly, such modules are arranged along an X-axis at an average distance p and along a Y-axis at an average distance q from each other. In this way, a corresponding grid or array comparable to FIG. 5 or FIG. 4 is formed. FIG. 6 shows that a respective first electrical standard contact 7 can be generated from two contacts, for example. In particular, such standard contacts 7a and 7b can be shaped and formed identically to the two repair contacts 15 and 17. This simplifies a production of such a grid as well as a placement of a respective chip 1 and 1' on the corresponding electrical contacts.

Figure 7:
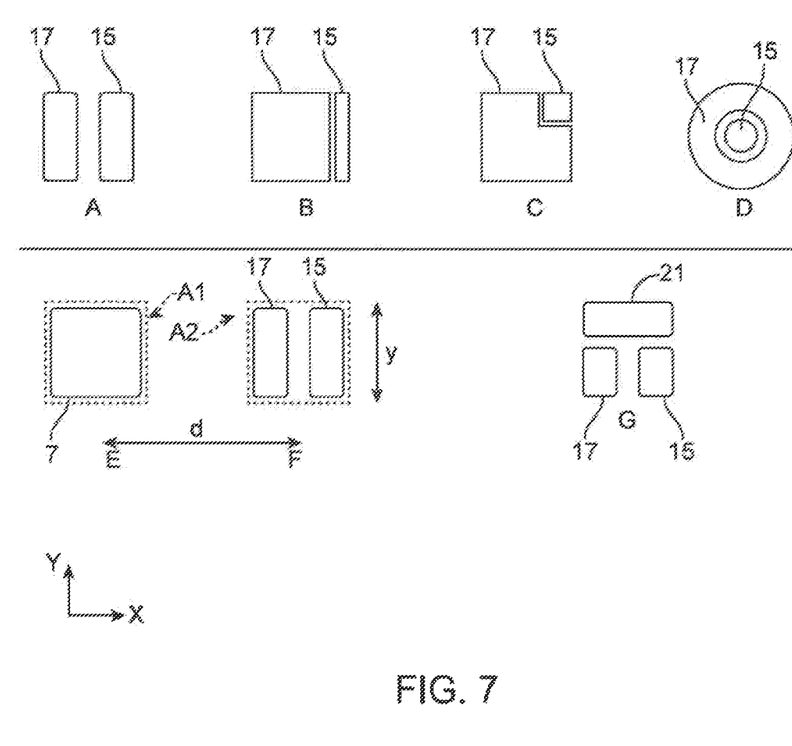
FIGS. 7A-G show examples of first and second repair contacts according to the invention compared to a first standard contact.

FIGS. 7A to 7D and 7F and 7G show examples of first and second electrical repair contacts 15 and 17 compared to a first standard electrical contact 7 in FIG. 7E. FIGS. 7A, 7B, 7C and 7D show examples of two repair contacts 15 and 17 on which a repair chip 1' can be placed. FIG. 7A shows two equal-area first and second electrical repair contacts 15 and 17 extending spatially in an X-Y plane along a Y-axis. FIG. 7B shows a rectangular shape of a first electrical repair contact 15 also extending in the Y-direction, next to which another rectangular shape of a second electrical repair contact 17 also extending in the Y-direction is arranged. The first electrical repair contact 15 is spaced from the second electrical repair contact 17 by an elongated interruption strip. The surfaces of the first and second electrical repair contacts 15 and 17 together with the interruption strip form a square. FIG. 7C shows a square configuration of the first electrical repair contact 15. This first electrical repair contact 15 is spaced from the second electrical repair contact 17 on two side lines by means of two corresponding interruption strips, the surfaces of the first electrical repair contact 15 and the second electrical repair contact 17 also forming a square together with the interruption strips. FIG. 7D shows an example in which a first electrical repair contact 15 may be arranged within a second electrical repair contact 17. According to this example, the first electrical repair contact 15 is formed as a circle around which the second electrical repair contact 17 is arranged in the form of a ring with a spacer area which is annular.

FIG. 7E shows an example of a square extension of the standard electrical contact 7, where the first standard electrical contact 7 has a surface A1. In contrast, FIG. 7F shows an arrangement of first electrical repair contact 15 and second electrical repair contact 17. These rectangular configurations have a length Y as shown in FIG. 7A. Both rectangles of the first and the second electrical repair contact 15 and 17 form a total area A2. FIGS. 7E and 7F also show an example of a spacing between standard contact 7 and repair contact 15 and 17. A spacing is indicated here as d.

FIG. 7E shows an example of a standard electrical contact 7 or 9 with a total area A1. FIG. 7F shows an example of two adjacent repair contacts 15 and 17, the latter consisting of two contact surfaces and comprising a total area A2. The standard contact comprising an enclosing area of A1. For example, the amount of |A1−A2|≤0.5 (A1+A2)/2. In particular, it may be that |A1−A2|≤0.1 (A1+A2)/2. This means that here the enclosing areas of the two contact types differ by at most 50% and at most 10%, respectively.

FIG. 7G shows that more than two contacts may be formed in the plane of the first electrical repair contact 15 and the second electrical repair contact 17. FIG. 7G shows, in addition to the first electrical repair contact 15 and the second electrical repair contact 17, a further electrical repair contact 21. That is to say, a repair chip 1' can be placed on a plurality, in this case greater than two, of electrical repair contacts whose surfaces or contact areas can all be arranged in one plane. In this way, further electrical contacts can be produced and in this way, for example, further electronic switches can be actuated. A repair chip 1' can thus electrically connect a plurality of electrical contacts or corresponding electrical contact surfaces and thus contacts. In this way, any number of electrical contacts can be produced, which can be used in different ways. In principle, further electronic switches can be opened or closed. In FIG. 7G, electrical repair contacts 15 and 17 are rectangles extending in the Y-direction, and a further electrical repair contact 21 is arranged above them in the Y-direction. The latter forms a rectangle extending in the X-direction. All rectangular corners can be rounded.

Figure 8:
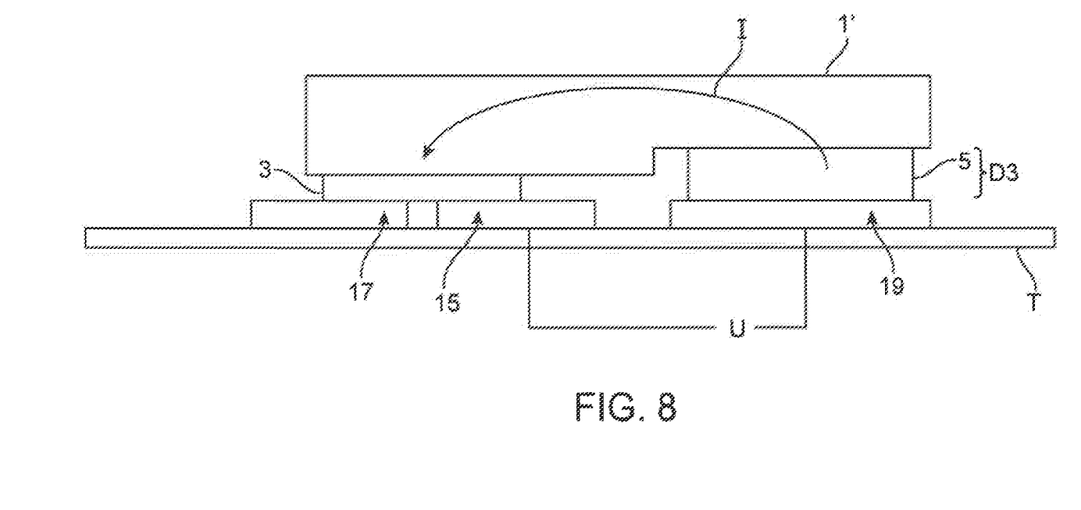
FIG. 8 another example of a device according to the invention.

FIG. 8 shows another example of a device according to the invention, namely with an example of a further repair chip 1'. According to FIG. 8, the first, the second and the third electrical repair contacts 15, 17 and 19 are arranged in one plane on a common carrier T. The second electrical contact 5 of the electrically connected repair chip 1' comprises an electrically conductive material forming a surface and with a third thickness D3. The third thickness D3 of the second electrical contact 5 is provided such that the repair chip 1' can be electrically connected to the third electrical repair contact 19. In this way, a voltage can be applied to the third electrical repair contact 19 and the first or second electrical repair contact, so that, in addition, an electrical current can flow via the third electrical repair contact 19, via the first and second electrical contacts 3 and 5 and via the first and/or second electrical repair contact 15 and/or 17. In FIG. 8, this current flow I is shown as a curved arrow. FIG. 8 shows that the repair chip 1' can be placed on further contacts which can also be located on the same side of the chip 1' as the first repair contact 15 and the second repair contact 17. Through these further electrical repair contacts, a current flow I can take place through the repair chip 1' to the first and second repair contacts 15 and 17 to operate the repair chip 1'.

In contrast to FIG. 8, FIG. 3 shows that the first and second electrical repair contacts 15 and 17 are arranged in a plane, in particular a common carrier T, with the first standard electrical contact 7, the third electrical repair contact 19 likewise is arranged in one plane, in particular a second common carrier, with the second standard electrical contact 9.

Figure 9A:
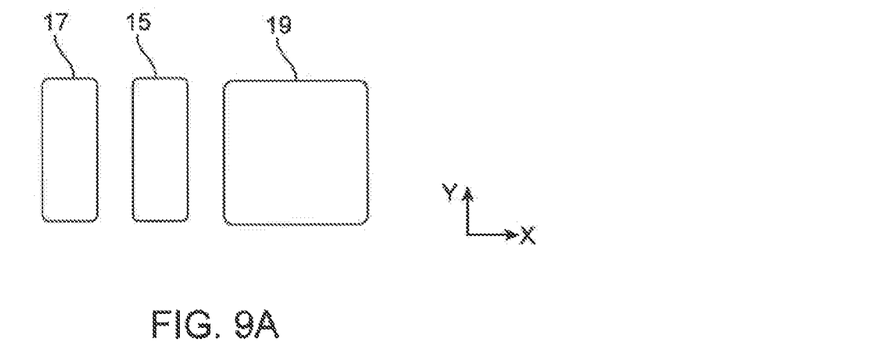
FIG. 9A another embodiment of repair contacts.
Figure 9B:
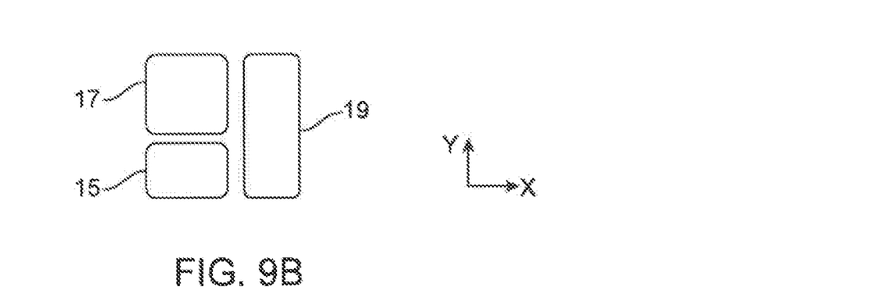
FIG. 9B another embodiment of repair contacts.
Figure 9C:
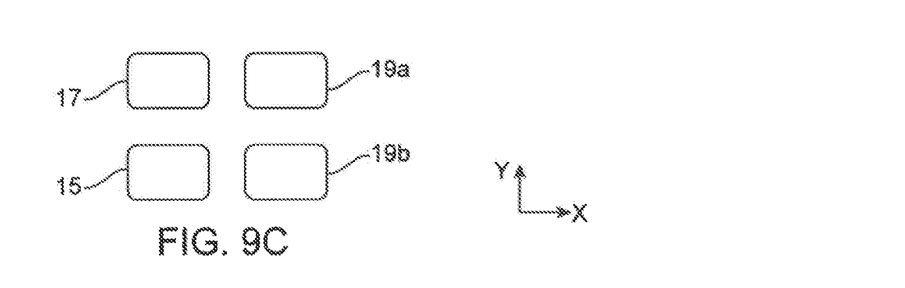
FIG. 9C another example of repair contacts according to the invention.

FIGS. 9A to 9C show examples of geometries of first, second and third repair contacts. These can be used, for example, in a device according to FIG. 8.

FIG. 9A shows a first example of surfaces of repair contacts. The first electrical repair contact 15 comprises the same rectangular area as the second electrical repair contact 17. Both rectangular areas extend along a Y-direction. According to FIG. 8, a third electrical repair contact is formed to the right of it in the X direction, which has the shape of a square. In the rectangles and squares, the corners may be rounded. The side length of the square corresponds to the longitudinal extension of the rectangles in the Y direction. The distances between adjacent contacts in the X direction are equal.

FIG. 9B shows a configuration of the surfaces of the first, second and third electrical repair contacts 15, 17 and 19. The surface of the first electrical repair contact 15 is square, the surface of the second electrical repair contact 17 is rectangular and extends longitudinally in the Y-direction above the square. Adjacent to these two surfaces in the X-direction to the right is the third electrical repair contact 19 as a rectangle extending in the Y-direction, the length of which is equal to the total length of the first electrical repair contact 15 and the second electrical repair contact 17 including a spacer area therebetween. The first and second electrical repair contacts 15 and 17 are of equal width and of different width to the width of the third electrical repair contact 19.

FIG. 9C shows another example of electrical repair contacts according to the invention. The electrical repair contacts have the same surface area. Here, a third electrical repair contact 19 is divided into two repair contact areas 19a and 19b, these areas forming rectangles extending along their length in an X-direction and arranged side by side in a Y-direction. Symmetrical to an axis in a Y direction thereto are formed and positioned the first electrical repair contact 15 and the second electrical repair contact 17. All four repair contacts have the same area. Corresponding to the first electrical repair contact 15 and second electrical repair contact 17, the two electrical repair contacts 19a and 19b can be electrically connected to each other by means of a repair chip 1' placed on all electrical repair contacts in such a way that, in addition, a further electronic switch is switched. Depending on the task, standard electrical contacts and/or electrical repair contacts can be divided over a wide area, depending on which switching tasks are to be solved.

Figure 10:
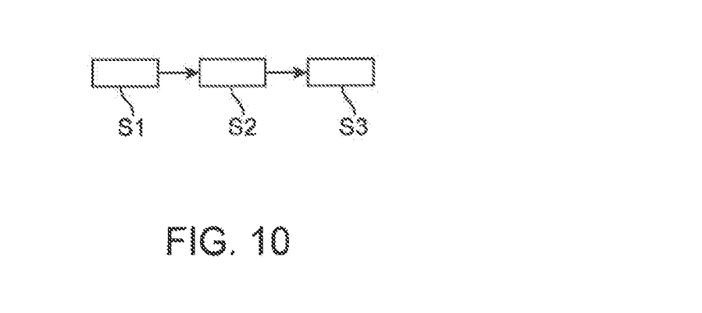
FIG. 10 an example of a method according to the invention.

FIG. 10 shows an embodiment of a method according to the invention. The method relates to the replacement of at least one chip or electronic element of an electronic component, which may be, for example, an LED package or an LED display, using devices according to the invention. With a first step S1, an electrical connection of a chip comprising at least two electrical contacts to at least one standard electrical contact can be carried out. If a chip is connected to a first contact, the chip can already be detected as defective. For this, the chip does not necessarily have to be electrically operated, i.e. connected to two contacts. This information can also come from other measurements or preliminary measurements. Then a repair chip is connected. Only then the second contact of the defective chip could be formed, for example together with the third contact of the repair chip. By means of a second step S2, a check of the quality of the chip or chips and an identification of chips as defective chips can be performed. By means of a third step S3, an electrical connection of a repair chip, identical in construction to the chip, to at least three electrical repair contacts can be performed, wherein the repair chip is power supplied by means of the first and third repair contacts and electrically connects the first and second repair contacts to each other such that an electronic switch disconnects the defective chip from a power supply source. In this manner, a defective chip would be replaced and switched powerless.

The process can be carried out for a variety of chips. After providing a carrier or substrate with the appropriate standard contacts and repair contacts, chips can be placed on the standard electrical contacts and electrically connected and terminated. The quality of the chips can be checked, for example, by electrical operation, optical inspection or by using data from previous process steps. If defective chips are identified, additional chips can be placed on the repair contacts and electrically connected.

The device according to the invention and the method according to the invention can be carried out, for example, for a single chip. In principle, any plurality of chips can be placed on provided standard contacts and connected. For example, 100 chips or up to 1000000 chips can be electrically connected simultaneously. The arrangements according to FIG. 4, FIG. 5 and FIG. 6 show how a plurality of chips can simultaneously be electrically connected on standard contacts of a common carrier T. Accordingly, standard contacts 7, 7a and 7b are formed together with repair contacts 15 and 17.

LIST OF REFERENCE SIGNS 1 chip
1' repair chip
1" defective chip
3 first electrical contact
5 second electrical contact
7 first standard contact
9 second standard contact
11 electronic switch
13 electric power supply source
15 first electrical repair contact
17 second electrical repair contact
19 third electrical repair contact
21 further electrical repair contact
D thickness
T carrier
p, d, q distances
A surfaces

The invention claimed is:

1. A device for replacing at least one chip or electronic element of an electronic component, comprising
at least a first and a second standard electrical contact to which a chip comprising at least a first and a second electrical contact is electrically connectable;
an electronic switch electrically connecting the first standard electrical contact to an electrical power supply source; and
at least a first, a second and a third electrical repair contact to which a repair chip identical in construction to the chip is electrically connectable, the first electrical repair contact being electrically connected to the electrical power supply source, the second electrical repair contact being electrically connected to the electronic switch, and the third electrical repair contact being electrically connected to the second standard electrical contact, wherein the first electrical repair contact is electrically isolated from the second electrical repair contact when the first electrical repair contact and the second electrical repair contact are free from being electrically connected to the repair chip.

2. The device according to claim 1,
wherein the electronic switch comprises a transistor having a gate which is electrically coupled to the second electrical repair contact.

3. The device according to claim 1,
wherein the first electrical contact of an electrically connected repair chip electrically connects the first electrical repair contact to the second electrical repair contact.

4. The device according to claim 1,
wherein the second electrical contact of an electrically connected repair chip is electrically connected to the third electrical repair contact.

5. The device according to claim 1,
wherein the second standard electrical contact and the third electrical repair contact are electrically connected to ground or to a counterpole to the electrical power supply source.

6. The device according to claim 1,
wherein the first electrical contact of the repair chip comprises an electrically conductive material forming a surface with a first thickness.

7. The device according to claim 6,
wherein the standard electrical contacts and the electrical repair contacts each comprise an electrically conductive material forming a surface, in particular similar surface, with a second thickness.

8. The device according to claim 7,
wherein the first thickness is equal to the second thickness.

9. The device according to claim 7,
wherein the surfaces of the first and second standard electrical contacts are each rectangular, square or circular.

10. The device according to claim 7,
wherein the surfaces of the first and second electrical repair contacts are arranged in one plane and together form rectangular, square or circular as a total surface.

11. The device according to claim 7,
wherein at least one further contact surface is added to the surfaces of the first and second electrical repair contacts arranged in one plane, the total surface being formed rectangular, square or circular.

12. The device according to claim 7,
wherein the surface of the first standard electrical contact is divided into at least two surfaces arranged in one plane and separated from each other.

13. The device according to claim 12,
wherein the at least two surfaces of the first standard electrical contact together form a rectangle, a square or a circle.

14. The device according to claim 12,
wherein the at least two surfaces of the first standard electrical contact resemble the surfaces of the first and second electrical repair contacts.

15. The device according to claim 4,
wherein the first and second electrical repair contacts are arranged in one plane with the first standard electrical contact, and the third electrical repair contact is arranged in one plane with the second standard electrical contact.

16. The device according to claim 4,
wherein the first, second and third electrical repair contacts are arranged in one plane, and the second electrical contact of an electrically connected repair chip comprises an electrically conductive material forming a surface and with a third thickness.

17. The device according to claim 16,
wherein the surface of the third electrical repair contact is divided into two surfaces arranged in one plane and separated from each other.

18. The device according to claim 17,
wherein the surface(s) of the third electrical repair contact is/are rectangular, square or circular.

19. The device according to claim 15,
wherein the first and second electrical repair contacts are arranged in an X-Y plane with a first spacing adjacent to the first standard electrical contact, and the first and second electrical repair contacts together with the first standard electrical contact form a module, wherein a plurality of modules are arranged with a second spacing adjacent to each other along an X-axis and with a third spacing adjacent to each other along a Y-axis.

20. The device according to claim 1,
wherein the chip comprising at least the first and the second electrical contacts is electrically connected to the at least first and second standard electrical contacts.

21. A method for replacing at least one chip or electronic element of an electronic component, by means of a device according to claim 1, comprising the steps
electrically connecting the chip comprising at least the first and the second electrical contacts to at least the first standard electrical contact;
checking the quality of the chip and identify the chip as a defective chip; and
electrically connecting a repair chip identical in construction to the chip to at least the first, the second and the third electrical repair contacts, the repair chip being supplied with power by means of the first and third repair contacts and electrically connecting the first and second repair contacts to one another, so that an electronic switch disconnects the defective chip from an electrical power supply source.

22. The method according to claim 21,
wherein a plurality of chips, in particular 100 to 1000000 chips in particular simultaneously, are electrically connected, checked and, if necessary, replaced by a repair chip.

* * * * *